Aug. 26, 1958 H. R. HESSE 2,849,602
HETERODYNE CIRCUIT
Filed March 1, 1952
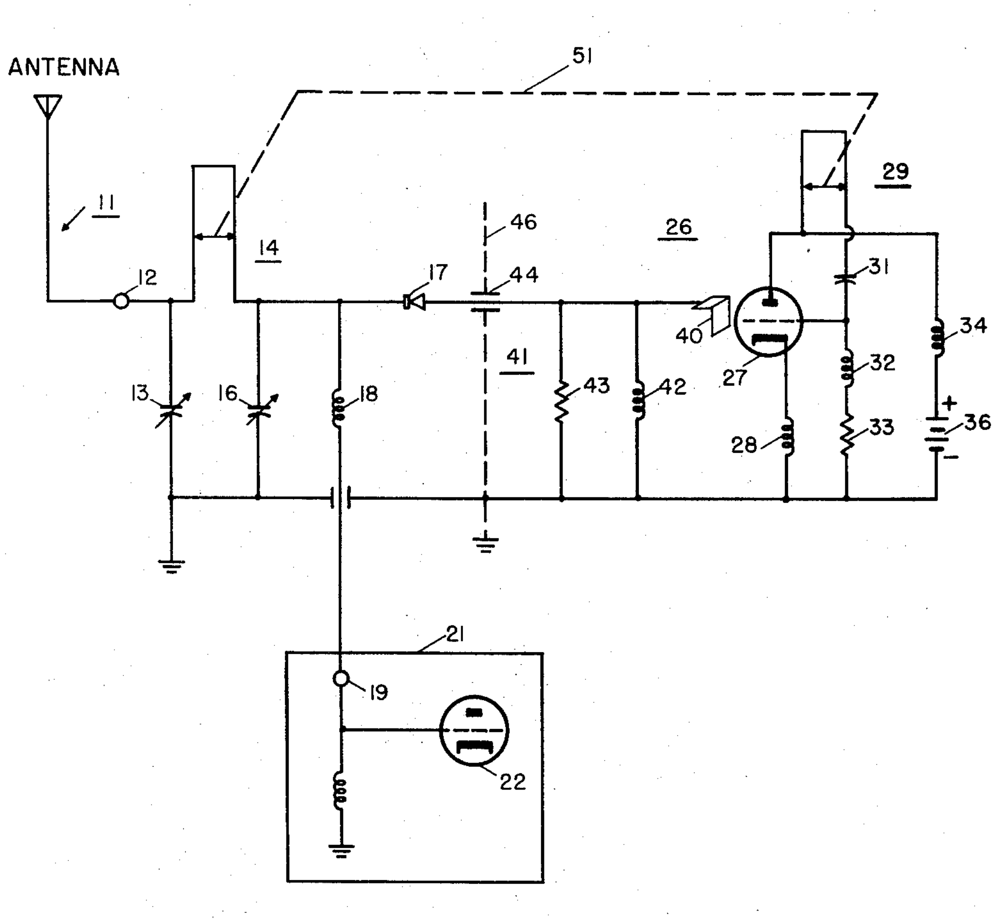
INVENTOR.
HENRY R. HESSE
BY Darby & Darby
ATTORNEYS 2,849,602
Patented Aug. 26, 1958

2,849,602

HETERODYNE CIRCUIT

Henry R. Hesse, East Paterson, N. J., assignor to Allen B. Du Mont Laboratories, Inc., Clifton, N. J., a corporation of Delaware Application March 1, 1952, Serial No. 274,440

3 Claims. (Cl. 250—20)

This invention relates to heterodyne mixer circuits and especially to such circuits for use at ultra high frequencies.

An object of the invention is to provide an improved heterodyne circuit.

Other objects are to provide a more efficient heterodyne circuit and to couple energy from an oscillator into a mixer circuit so that the injection energy remains substantially constant over a wide tuning range of frequencies.

Other objects and advantages of the invention will in part be obvious and in part appear hereinafter.

In heterodyne circuits for use at ultra high frequencies, a crystal diode is commonly used to perform the function of mixing a signal of radio-frequency with one of local-oscillator frequency, in order to produce a resulting intermediate-frequency signal. It is important that the local oscillator signal be coupled to the crystal mixer in such a manner that a uniform injection current is obtained in the crystal, thereby achieving a low noise figure and better input impedance matching. Furthermore, the oscillator signal injection network preferably absorbs a minimum amount of signal power, in order to achieve efficiency.

The present invention comprises a heterodyne circuit and an oscillator injection network incorporated therein which may be electrically characterized as a voltage divider network which provides a controlled ratio of voltage division over a specified range of frequencies. By providing for the application of the controlled voltage, there is insured an essentially constant amount of oscillator injection current in the crystal diode circuit.

Referring to the single figure of the drawing which shows a preferred embodiment of the invention, a source 11 of radio-frequency signals, which may be an antenna, is connected to an input terminal 12 of the circuit. A first shunt capacitor 13 is connected between the input terminal and ground. A first tuning element 14, which may be a tuned line as is shown schematically, is connected in series with the input terminal 12 and a second shunt capacitor 16 is connected between the remaining end of the tuned element 14 and ground. A terminal of a crystal diode 17 is connected to said second shunt capacitor 16 and is also connected through an inductance 18 to an input terminal 19 of an intermediate-frequency amplifier 21, in which the input terminal 19 preferably is connected to the grid or input electrode of an amplifier tube 22. An oscillator circuit 26 comprises tube 27, comprising an envelope enclosing a cathode connected through an inductance 28 to ground, an output electrode connected through a series-connected second tuned element 29, shown schematically as being a tuned line, and an isolating capacitor 31, to a grid or input electrode which is returned to ground through an inductance 32 and resistance 33. The output electrode also is connected through an inductance 34 to a source of voltage 36.

A pickup device 40 is positioned adjacent the envelope of the tube 27, and preferably comprises a tab formed of metal or other conductive material arranged so that it can be bent or shifted with respect to the tube 27. The pickup device 40 is electrically coupled to the crystal diode 17 through an injection network 41 comprising an inductance 42, a resistance 43 and a capacitance 44 all conected in shunt therewith. The capacitance 44 and inductance 42 are chosen to have values which resonate at a frequency near the lower end of the tuning range provided by the tuning elements 14 and 29. The capacitance 44 is preferably made in the form of a feed-through bushing positioned in a shielding partition 46 which is positioned to shield the oscillator circuit 26 from the remaining parts of the heterodyne circuit.

The circuit operates as follows: The oscillator circuit 26 oscillates at a frequency determined by the adjustment of the tuning element 29 in a well known manner. Oscillation energy is capacitively picked up by the pickup element 40 from the oscillator tube 27; preferably the tube 27 is constructed internally so that the elements therein form coaxially arranged cylinders, the outer one of said cylinders being the anode or output electrode, so that the element 40 picks up energy from the anode of the tube 27. The position of the pickup element 40 is adjusted to provide the optimum capacitive coupling with respect to the electrodes in the tube 27.

The oscillatory energy is fed through the injection network 41 to the crystal diode 17. When the frequency to which the circuits are tuned is changed, viz. by adjusting the tuning elements 14 and 29, which preferably are ganged in tandem as is indicated by the dotted line 51, the coupling between the pickup element 40 to the tube 27 and the impedance of the injection network 41 both change in a manner such that the oscillator current which is fed into the crystal diode 17 remains substantially constant. For example, when the circuits are tuned to a relatively low frequency, the injection network 41, being parallel-tuned to a relatively low frequency, presents a relatively high impedance to the injection signal and a certain amount of oscillator energy is picked up by the element 40 and fed to the diode 17. When the circuits are tuned to a higher frequency, the oscillator energy picked up by the element 40 becomes relatively greater, since the impedance of the capacitive coupling between the element 40 and the tube 27 becomes relatively less as the frequency is increased. At the same time, however, the impedance of the parallel tuned injection network 41 becomes relatively less, since a parallel tuned circuit has a lower impedance at frequencies different from that to which the circuit is resonantly tuned. The resistance 43 functions to broaden the resonance characteristic of the tuned circuit 42, 44. This is known in the art as "damping."

In effect, the coupling element 40 and the injection circuit 41 form a voltage divider network which, because of its characteristics, provides a controlled ratio of voltage division over the range of frequencies with which it is used. This controlled voltage division insures a relatively constant amount of oscillator injection current in the crystal diode 17, thereby achieving the objects of the invention. If the inductance 42 were omitted from the circuit, the oscillator-injection energy would be uneven over the tuning range because the capacitance 44, being shunted by the intermediate-frequency amplifier 21, would respond to frequency changes in a different manner than would the condenser 40.

The capacitance 44, being built into the shield partition 46, thereby has low inherent inductance and provides a more efficient injection circuit. The capacitance 44 may comprise, for example, a tubular hollow conductive element attached to and through the shield partition 46, with a wire for the injection current passing through and insulated from the tubular element. Thus, the shield 46 itself provides one plate of the capacitor 44. Alternatively, the condenser 44 may comprise one or more conductive discs concentrically attached to the wire carrying the injection current and positioned in closely spaced proximity to the shield partition 46.

While a preferred embodiment of the invention has been described in detail, modifications thereof will be apparent to those skilled in the art.

What is claimed is:

1. A heterodyne circuit comprising an oscillator tube having an insulative envelope and grid and anode electrodes therein, a linear tuned circuit and a blocking capacitor connected in series between the grid and anode electrodes of said oscillator tube, a conductive element positioned adjacent to and outside said envelope to form a capacitance with one of said electrodes, the dielectric of said capacitance comprising the intervening air and tube envelope portion, a signal mixing device conductively connected in series with said conductive element, a parallel tuned circuit connected in shunt between said conductive element and ground, a source of radio frequency signals connected to said signal mixing device and ground, and an intermediate frequency amplifier connected to said signal mixing device, a shielding partition positioned between said conductive element and said signal mixing device, a connection between said conductive element and said signal mixing device which connection comprises an electrical conductor passing through an opening in said partition, the capacitive component of said shunt connected parallel tuned circuit being the capacitance formed between said electrical conductor and said partition in the vicinity of said opening.

2. The circuit in accordance with claim 1, in which the position of said conductive element is adjustable with respect to said oscillator tube.

3. The circuit in accordance with claim 1, in which said oscillatory circuits are tunable over a range of frequencies, and said shunt-connected parallel-tuned circuit is resonant at a frequency near the lower-frequency limit of said tunable range.

References Cited in the file of this patent

UNITED STATES PATENTS

| | | |
|---|---|---|
| 1,416,774 | Bardeloni | May 23, 1922 |
| 2,141,756 | Linsell | Dec. 27, 1938 |
| 2,168,052 | Snyder | Aug. 1, 1939 |
| 2,233,166 | Hahn | Feb. 25, 1941 |
| 2,314,309 | Hobbs | Mar. 16, 1943 |
| 2,341,346 | Summerhayes | Feb. 8, 1944 |
| 2,425,352 | Sloss | Aug. 12, 1947 |
| 2,453,078 | Posthumus | Nov. 2, 1948 |
| 2,455,657 | Cork et al. | Dec. 7, 1948 |
| 2,534,521 | King | Dec. 19, 1950 |
| 2,543,891 | Carlson | Mar. 6, 1951 |
| 2,548,132 | Taylor | Apr. 10, 1951 |
| 2,584,796 | Fisher | Feb. 5, 1952 |
| 2,590,864 | Johnson | Apr. 1, 1952 |
| 2,598,534 | Gordon | May 27, 1952 |
| 2,653,228 | Pan | Sept. 22, 1953 |
| 2,688,691 | Pan | Sept. 7, 1954 |